United States Patent
Kim et al.

(10) Patent No.: US 6,671,335 B1
(45) Date of Patent: Dec. 30, 2003

(54) DECODER HAVING A GAIN CONTROLLER IN A MOBILE COMMUNICATION SYSTEM

(75) Inventors: Min-Goo Kim, Suwon-shi (KR); Beong-Jo Kim, Songnam-shi (KR); Young-Hwan Lee, Songnam-shi (KR); Soon-Jae Choi, Songnam-shi (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 09/473,767

(22) Filed: Dec. 29, 1999

(30) Foreign Application Priority Data

Dec. 31, 1998 (KR) ......................... 1998-62726

(51) Int. Cl.[7] ................. H04L 27/06; H03M 13/03
(52) U.S. Cl. ..................... 375/340; 714/786
(58) Field of Search ................ 375/340, 253; 370/441; 714/786

(56) References Cited

U.S. PATENT DOCUMENTS

| 5,446,747 A | * | 8/1995 | Berrou | 714/788 |
| 6,094,427 A | * | 7/2000 | Yi | 370/222 |
| 6,119,264 A | * | 9/2000 | Berrou et al. | 714/786 |
| 6,480,503 B1 | * | 11/2002 | Yamaguchi et al. | 370/441 |
| 6,493,333 B1 | * | 12/2002 | Kim et al. | 370/331 |
| 2002/0186786 A1 | * | 12/2002 | Seo | 375/308 |

FOREIGN PATENT DOCUMENTS

| JP | 2000-508849 | 7/2000 |
| WO | WO97/38495 | 10/1997 |

OTHER PUBLICATIONS

Berrou et al., Near Optimum Error Correcting Coding and Decoding: Turbo–Codes, Oct. 1996, IEEE Transactions On Communications, vol. 44, No. 10, pp. 1261–1271.*

Japanese Office Action dated Sep. 17, 2000 issued in a counter part application, namely Appln. No. 2000-592959.

* cited by examiner

*Primary Examiner*—Stephen Chin
*Assistant Examiner*—Lawrence Williams
(74) *Attorney, Agent, or Firm*—Dilworth & Barrese, LLP

(57) ABSTRACT

An iterative decoder with a gain controller in a mobile communication system. In the iterative decoder, a first component decoder receives a first extrinsic information signal, a first parity signal, and a systematic code signal, decodes the systematic code signal out of the received signals, and generates a primary decoded signal including a second extrinsic information component. Here, the first and second extrinsic information signals remove noise in the input signals to the first and second component decoders. A second component decoder receives the primary decoded signal from the first component decoder and a second parity signal, decodes the decoded signal out of the received signals, and generates a secondary decoded signal and the first extrinsic information signal. One or more gain controllers are connected between the first and second component decoders, for attenuating either or both the first and second extrinsic information signals.

34 Claims, 6 Drawing Sheets

DECODER HAVING A GAIN CONTROLLER IN A MOBILE COMMUNICATION SYSTEM

PRIORITY

This application claims priority to an application entitled "Decoder Having Gain Controller in Mobile Communication System" filed in the Korean Industrial Property Office on Dec. 31, 1998 and assigned Serial No. 98-62726, the contents of which are hereby incorporated by reference.

BACKGROUND OF THE INVENTION

1. Field of the Invention

The present invention relates generally to a concatenated iterative decoder for a receiver in a mobile communication system, and in particular, to an iterative decoder having a gain controller for controlling the gain of an extrinsic information signal output from a component decoder in a mobile communication system.

2. Description of the Related Art

Some future mobile communication systems, such as IMT-2000 (CDMA 2000) and UMTS (Universal Mobile Telecommunication System), are expected to use a turbo code, which requires an iterative decoder. Satellite communication systems and deep space communication systems use turbo codes, such as concatenated convolutional codes, concatenated block codes, or product convolutional codes.

A typical iterative decoder is constituted out of a plurality of component decoders serially concatenated. Each component decoder is a SISO (Soft-In Soft-Out), SOVA (Soft Output Viterbi Algorithm), or MAP (Maximum A Posteriori Probability) decoder.

A turbo decoder with two component decoders will be described by way of example. The component decoder at the front end is called the first component decoder and the component decoder at the rear end is called the second component decoder.

The first component decoder receives a systematic code signal, a first parity signal, and a first extrinsic information signal for decoding, and outputs a primary decoded signal including a systematic code signal component and a reliability value component (hereinafter, referred to as second extrinsic information) representing the new extrinsic information of a decoded result. The second component decoder receives the primary decoded signal from the first component decoder and a second parity signal among parity signals on a radio channel, for decoding and outputs a secondary decoded signal including the first extrinsic information signal component representing the new extrinsic information of the secondary decoded result. The first extrinsic information signal component is fed back to the input of the first component decoder.

As described above, the conventional turbo decoder decodes a received signal with extrinsic information generated from each component decoder, regardless of channel status.

SUMMARY OF THE INVENTION

It is, therefore, an object of the present invention to provide an iterative decoder having a plurality of component decoders and a gain controller for controlling the gains of the extrinsic information signals generated from the component decoders according to the channel status, in a mobile communication system.

It is another object of the present invention to provide an iterative decoder having a plurality of component decoders and a gain controller for controlling the gains of the extrinsic information signals generated from the component decoders with fixed attenuation values according to channel status in order to optimize decoding in a mobile communication system.

In accordance with one aspect of the present invention, an iterative decoder comprises a first component decoder for receiving a first extrinsic information signal, a first parity signal, and a systematic code signal, decoding the systematic code signal out of the received signals, and generating a primary decoded signal including a second extrinsic information component, where the first and second extrinsic information signals are used for reducing noise in the input signals; a second component decoder for receiving the primary decoded signal from the first component decoder and a second parity signal, decoding the decoded signal out of the received signals, and generating a secondary decoded signal including the first extrinsic information signal; and a gain controller connected between the first and second component decoders, for attenuating the second extrinsic information signal of the decoded signal received from the first component decoder.

In accordance with another aspect of the present invention, an iterative decoder comprises a first component decoder for receiving a first extrinsic information signal, a first parity signal, and a systematic code signal, decoding the systematic code signal out of the received signals, and generating a primary decoded signal including a second extrinsic information component, where the first and second extrinsic information signals are used for reducing noise in the input signals; a second component decoder for receiving the primary decoded signal from the first component decoder and a second parity signal, decoding the decoded signal out of the received signals, and generating a secondary decoded signal including the first extrinsic information signal; and a gain controller connected between the first and second component decoders, for attenuating the first extrinsic information signal in the signal received from the second component decoder.

In accordance with further another aspect of the present invention, an iterative decoder comprises a first component decoder for receiving a first extrinsic information signal, a first parity signal, and a systematic code signal, decoding the systematic code signal out of the received signals, and generating a primary decoded signal including a second extrinsic information component, where the first and second extrinsic information signals for reducing noise in the input signals; a second component decoder for receiving the primary decoded signal from the first component decoder and a second parity signal, decoding the decoded signal out of the received signals, and generating a secondary decoded signal including the first extrinsic information signal; a first gain controller connected between the first and second component decoders, for attenuating the second extrinsic information signal in the primary signal received from the first component decoder; and a second gain controller connected between the first and second component decoders, for attenuating the first extrinsic information signal in the secondary signal received from the second component decoder.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described hereinbelow with reference to the accompanying drawings. In the following description, well-known functions or constructions are not described in detail since they would obscure the invention in unnecessary detail.

According to various preferred embodiments of the present invention, the gain of the extrinsic information signal generated from a component decoder can be controlled by determining a gain control value from one of the following, some of which can be fixed values obtained by simulation or numerical results: SNR; energy to noise power ratio ($E_b N_o$); a function of extrinsic information; adaptive algorithms using the B Error Rate (BER); adaptive algorithms using a target measurement as an extrinsic information variance; or a combination of the above five methods. Each source for determining the gain control value corresponds to a method for gain control: the first method uses an empirically determined optimal constant based on the SNR; the second method uses a gain value inversely proportional to $E_b/N_o$; the third method uses a function of the extrinsic information variance; the fourth method uses a function of the BER; and the fifth method uses a target measure measurement as an extrinsic information variance.

Figure 1:
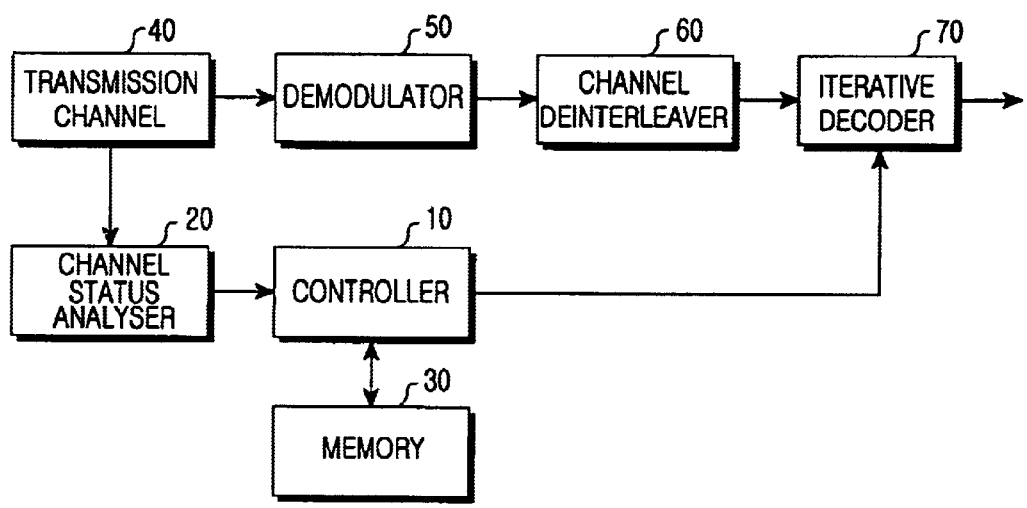
FIG. 1 is a block diagram of a receiver including an iterative decoder with a gain controller in a mobile communication system according to an embodiment of the present invention.
Figure 2:
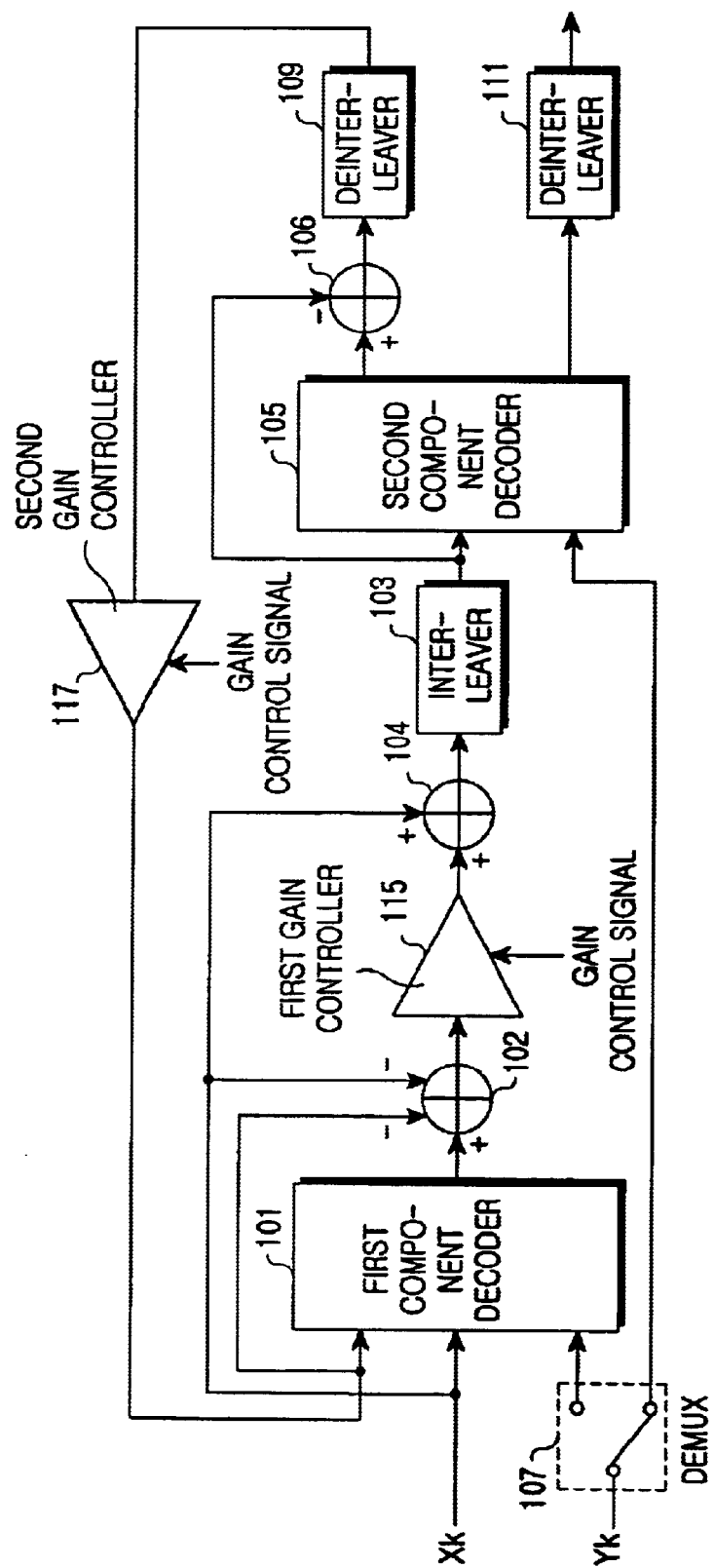
FIG. 2 is a block diagram of an embodiment of the iterative decoder shown in FIG. 1.
Figure 3:
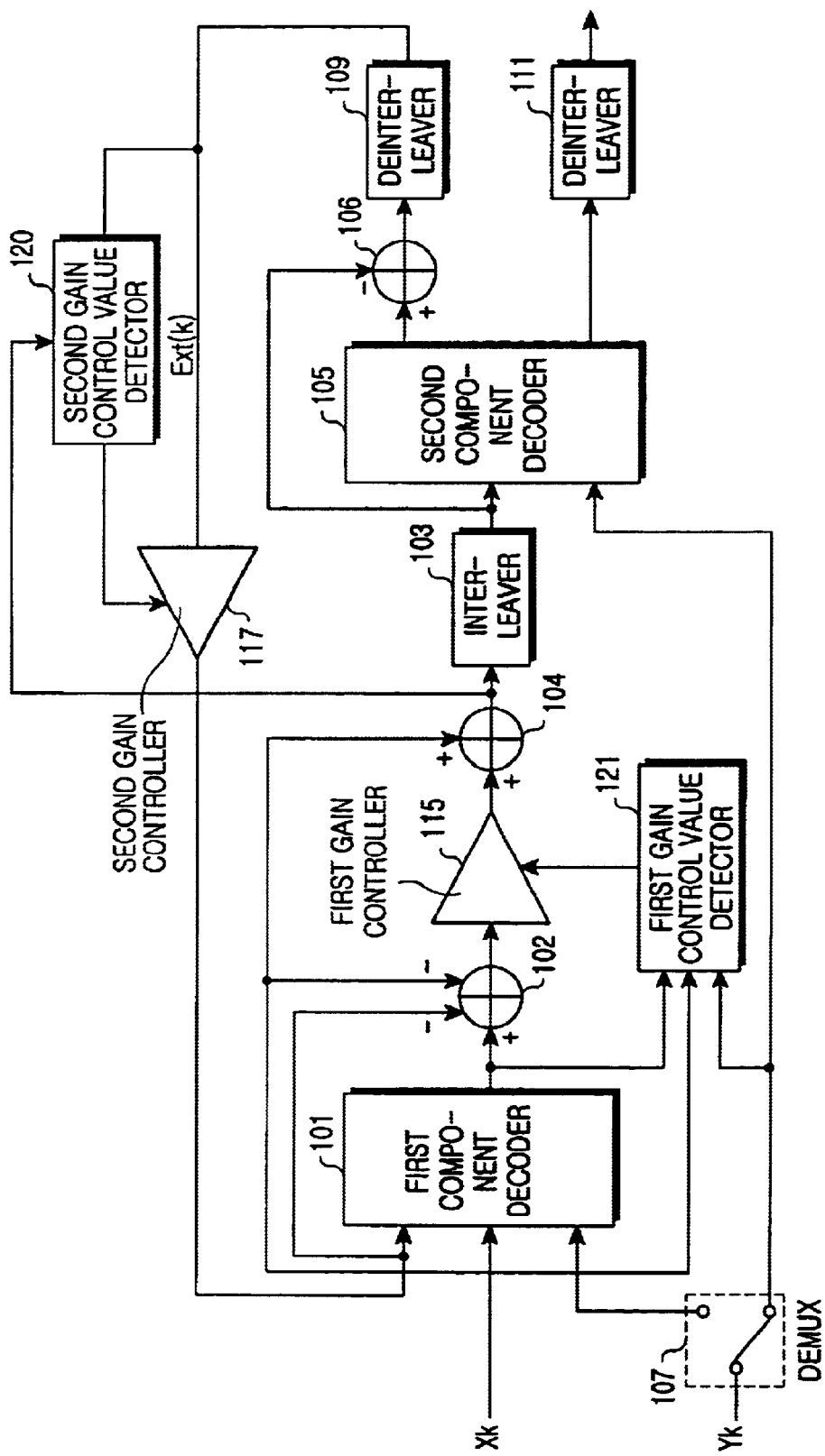
FIG. 3 is a block diagram of another embodiment of the iterative decoder shown in FIG. 1.

FIG. 1 is a block diagram of an iterative decoder having a gain controller in a mobile communication system according to an embodiment of the present invention. Referring to FIGS. 1 and 2, a description will be given of the configuration and operation of the iterative decoder according to the first and second methods. FIG. 3 will be used to describe the operation of the iterative decoder according to the third and fourth methods.

In FIG. 1, a controller 10 provides overall control to the iterative decoder. A memory 30 stores iterative decoder environment set-up information and gain control values determined by SNR or $E_b/N_o$. A transmission channel 40 receives data from a transmitter. A demodulator 50 demodulates signals received on the transmission channel 40. A channel deinterleaver 60 descrambles demodulated signals received from the channel demodulator 50 and outputs systematic code signals and a plurality of parity signals. An iterative decoder 70 includes a plurality of serially concatenated component decoders. The iterative decoder 70 decodes the systematic code signals and the plurality of parity signals received from the channel deinterleaver 60, and uses a plurality of extrinsic information signals. The gain of the extrinsic information signals is controlled by a gain control value, which depends on the status of the transmission channel 40, received from the controller. 10. The iterative decoder 70 controls the gain of an extrinsic information component, which is added after decoding, with the gain control value outputted from the controller. The configuration of the iterative decoder 70 will be described in detail with reference to FIGS. 2 and 3.

The iterative decoder 70 iteratively decodes N-bit data (consisting of systematic code signals and parity signals) corresponding to an information message by an iteration number control signal received from the controller 10. Upon receipt of an N-bit length frame signal on the transmission channel 40, the demodulator 50 demodulates the received frame signal. The channel deinterleaver 60 descrambles the demodulated data frame received from the demodulator 50 and outputs the systematic code signal and parity signals to the iterative decoder 70. A channel status analyser 20 detects a variable channel environment factor, that is, SNR or $E_b/N_o$, and feeds it to the controller 10. Then, the controller 10 outputs a gain control value, which is determined using the channel status, received from the memory 30 and the iterative decoding number based on the iterative decoder environment information to the iterative decoder 70. Although described here as changing with the channel status, the value of the gain control signal can be fixed regardless of channel status. The iterative decoder 70 manipulates the gain of the extrinsic information signal based on the gain control signal, and decodes a signal received from the channel deinterleaver 60 using the iterative decoding number.

FIG. 2 is a block diagram of an embodiment of the iterative decoder 70 with gain controllers in a mobile communication system according to an embodiment of the present invention. It is assumed that the iterative decoder 70 has two component decoders. FIG. 2 corresponds to the first and second methods of gain control. The first and second component decoders can be integrated into a single one because they are the same in operation except for different input values.

The iterative decoder 70 of FIG. 1 includes a first component decoder 101, a second component decoder 105, a first gain controller 115, a second gain controller 117, an interleaver 103, two deinterleavers 109 and 111, and a demultiplexer (DEMUX) 107.

Assuming that the channel deinterleaver 60 of FIG. 1 outputs a systematic code signal $X_k$ and a parity signal $Y_k$ including first and second parity signals $Y_{1k}$ and $Y_{2k}$, the first component decoder 101 receives $X_k$, $Y_{1k}$ from the DEMUX 107, and first extrinsic information from the deinterleaver 109, subjects $X_k$ to decoding, and outputs a primary decoded signal. The decoded output includes a decoded $X_k$ component, a first extrinsic information component, and a component of newly added extrinsic information about a decoded result (second extrinsic information signal). A subtracter 102 removes the $X_k$ component and first extrinsic information component from the primary decoded signal ($X_k$+EXT1+EXT2), and outputs only the second extrinsic information signal to a first gain controller 115.

The first gain controller 115 controls the gain of the second extrinsic information signal using predetermined gain control value and outputs the gain-controlled second extrinsic information signal an adder 104. The gain control value for use in controlling the gain is supplied from the controller 10 of FIG. 1 or can be set to a fixed value. The fixed value is experimentally obtained according to various channel states. The fixed value used in FIGS. 4 and 5 described below is about 1.7. The adder 104 adds $X_k$ received from the input end of the first component decoder 101 to the gain-controlled second extrinsic information signal. The interleaver 103 interleaves the output of the adder 104.

The second component decoder 105 decodes the interleaved signal received from interleaver 103 and $Y_{2k}$ received from the DEMUX 107, and outputs a secondary decoded signal including an $X_k$ component, the second extrinsic information signal component, and a first extrinsic information signal component newly generated from the second component decoder 105. A second subtracter 106 receives the interleaved $X_k$ and gain-controlled second extrinsic information from the interleaver 103 and the secondary decoded signals from the second component decoder 105, removes the second extrinsic information signal component EXT2 and the $X_k$ component from the secondary decoded signal ($X_k$+EXT1+EXT2), and outputs only the first extrinsic information signal component EXT1 to the first component decoder 101. The deinterleaver 109 deinterleaves the first extrinsic information signal received from the second subtracter 106. The deinterleaver 111 deinterleaves the secondary decoded signal received from the second component decoder 105. The deinterleavers 109 and 111 are used to rearrange a sequence of the interleaved output of the interleaver 103 in its original order.

Without the interleaver 103, there is no need for the deinterleavers 109 and 111. The second again controller 117 receives the first extrinsic information signal from the deinterleaver 109 or from the second subtracter 106 in the absence of the interleaver 103, controls the gain of the first extrinsic information signal with a gain control value received from the controller 10 of FIG. 1, or fixed value, and feeds the gain-controlled first extrinsic information signal to the first component decoder 101. While the gains of both the first and second extrinsic information signals output from the component decoders 101 and 105 are controlled, only either of the gains can be controlled. The first and second gain controllers 115 and 117 respectively use either the same gain control value or different gain control values.

A metric value $M_t$ accumulated in the first or second component decoder 101 or 105, respectively, by the first or second gain controller 115 or 117, respectively, for a predetermined time is calculated by $$M_t = M_{t-1} + u_t \cdot L_c \cdot Y_{t,1} + \sum_{j=2}^{N} X_{t,j} \cdot L_c \cdot Y_{t,j} + G \cdot u_t \cdot L(u_t) \quad (1)$$

where $M_t$ is an accumulated metric value for time t, $u_t$ is a codeword for a systematic bit, $X_{t,j}$ is a codeword for a parity bit, $Y_{t,j}$ is a value received on a channel, $L_c$ is channel reliability extrinsic information, $L(u_t)$ is the previous extrinsic information for time t, and G is a gain control value.

In the first and second methods among the five gain determining methods, the SNR and $E_b/N_o$ are used, as shown below.

The controller 10 generates the gain control value G in the first and second methods, that is, based on SNR or $E_b/N_o$, in the receiver of FIG. 1. The first method uses an empirically determined optimal constant as a gain control value, given by $$G = \text{constant}^{-1} \quad (1 \leq \text{constant} \leq 2.5) \quad (2)$$

where the constant range is set for all SNRs. The simulation results when the SNR is used as a gain control value for a SOVA component decoder are tabulated in Table 1.

TABLE 1

| $E_b/N_o$ (dB) | gain control fact | BER | FER |
| --- | --- | --- | --- |
| 1.0 | — | 3.80E–03 | 8.74E–02 |
| 1.0 | 1.5 | 5.798E–04 | 2.043E–02 |
| 1.0 | 1.6 | 5.332E–04 | 1.781E–02 |
| 1.0 | 1.7 | 3.432E–04 | 1.271E–02 |
| 1.0 | 1.8 | 3.510E–04 | 1.561E–02 |
| 1.0 | 1.9 | 3.609E–04 | 1.723E–02 |
| 1.0 | 2.0 | 3.742E–04 | 2.225E–02 |
| 1.5 | — | 1.98E–04 | 7.26E–03 |
| 1.5 | 1.5 | 1.531E–05 | 1.979E–03 |
| 1.5 | 1.6 | 1.343E–05 | 1.713E–03 |
| 1.5 | 1.7 | 1.390E–05 | 1.835E–03 |
| 1.5 | 1.8 | 1.149E–05 | 1.682E–03 |
| 1.5 | 1.9 | 1.328E–05 | 1.938E–03 |
| 1.5 | 2.0 | 1.646E–05 | 2.403E–03 |
| 2.0 | — | 3.28E–05 | 3.53E–03 |
| 2.0 | 1.5 | 2.960E–06 | 5.073E–04 |
| 2.0 | 1.6 | 2.417E–06 | 4.115E–04 |
| 2.0 | 1.7 | 2.268E–06 | 3.878E–04 |
| 2.0 | 1.8 | 2.378E–06 | 4.377E–04 |
| 2.0 | 1.9 | 2.258E–06 | 4.348E–04 |
| 2.0 | 2.0 | 2.421E–06 | 5.003E–03 |

Table 1 can be stored as a database in memory 30 and is controlled by the controller 10 as shown in FIGS. 1 and 2.

Simulation results from a SOVA component decoder are listed in Table 2.

TABLE 2

| | general feed-back | | feed-back gain control | |
| --- | --- | --- | --- | --- |
| SNR | BER | FER | BER | FER |
| 0.5 | 5.18E–02 | 6.23E–01 | 3.62E–01 | 1.00E–00 |
| 1.0 | 7.28E–03 | 1.70E–01 | 7.28E–03 | 1.72E–01 |
| 1.5 | 4.90E–04 | 2.38E–02 | 1.39E–05 | 1.72E–03 |
| 2.0 | 3.28E–05 | 3.53E–03 | 2.43E–06 | 5.01E–04 |

Table 2 can be stored in a database of memory 30 to be controlled by the controller 10 as shown in FIGS. 1 and 2.

In the second method, G is a value inversely proportional to $E_b/N_o$, calculated by $$G = M \cdot (E_b/N_o(\text{dB}))^{-1} \quad (3)$$

where M is a constant. For example, $E_b/N_o=1$ dB→G=M, $E_b/N_o=2$ dB→G=M/2.

The value empirically obtained in the first and second methods can be stored in the database of the memory 30 and fed as an optimal gain control value to the first and second gain controllers 115 and 117, respectively. It is noted from Table 2 that optimal BER and FER are achieved when the gain control factor is 1.7. Therefore, according to these simulation results, the gain control value should be fixed to 1.7.

The data presented hereinbelow are produced under the following conditions:

1. IMT-2000 F-SCH RS2 (Forward Supplemental Channel at Rate Set 2);
2. Code rate: 1/4;
3. Frame length: 568 bits (552 information bits+16 CRC bits);
4. An Additive White Gaussian Noise (AGWN) channel;
5. Termination: on;
6. Floatation point simulation;
7. 8 iterations;

8. Simulation stop criteria: frame error number 1000; and
9. Input data: random data.

For the third method, the gain control value is determined by a function of extrinsic information variance, and is, calculated as $$G = f\left(\frac{1}{N}\sum_{i=1}^{N}(Ext(i) - m_{Ext})^2\right) \quad (4)$$

$$m_{Ext} = \frac{1}{N}\sum_{i=1}^{N} Ext(i)$$

where N is the number of information bits and Ext(i) is extrinsic information.

In accordance with the third method, first and second gain control value detectors 121 and 120, respectively, are provided at the respective input ends of the first and second gain controllers 115 and 117, respectively, as shown in FIG. 3, so that they obtain gain control values derived using Eq.4 and output them to the gain controllers 115 and 117 to thereby control the gain of extrinsic information Ext(i). BER estimating adaptive algorithms that could be used in Eq. 4 include LMS (Least Mean Square) algorithms and modified LMS algorithms, for example.

In the fourth method, the BER is used in calculating any one of three functions, as described below.

The gain control value detector 121 subjects $X_k$ at the input end of the first component decoder 101 and information at the output end thereof to hard decision decoding, compares the hard-decision values, and checks the resulting BER. If the number of information bits input to the first component decoder 101 is N and the difference between the information bits and the decoded data bits is e, the BER is e/N. When e/N is smaller, which implies that the first component decoder 101 performed a poor decoding, there is no need for assigning a large gain to the resulting extrinsic information. When e/N is greater, a large gain (high reliability) is assigned. An intended gain can be adjusted through a function of a BER resulting from estimation of a BER at the input end of the component decoder, thereby increasing decoding performance. As shown in FIG. 3, the gain control value detector 121 can use $Y_k$ or $Y_{2k}$ as another extrinsic information for gain control.

Accordingly, the gain G1 of the first gain controller 121 is calculated by one of the following three functions.

Function 1:

$$G1 = \begin{cases} K_0\left(\frac{e}{N}\right) & \text{if } e \neq 0 \\ K_0 & \text{if } e = 0 \end{cases}$$

Function 2:

$$G1 = \begin{cases} K_0\exp\left(\frac{e}{N}\right) & \text{if } e \neq 0 \\ K_0 & \text{if } e = 0 \end{cases}$$

Function 3:

$$G1 = \begin{cases} K_0\log\left(\frac{e}{N}\right) & \text{if } e \neq 0 \\ K_0 & \text{if } e = 0 \end{cases} \quad (5)$$

Similarly, the second gain controller 120 compares the outputs of the adder 104 and the deinterleaver 109 and calculates a gain by Eq. 5.

The fifth method controls a gain in a plurality of adaptive algorithms using a target measurement as an extrinsic information variance.

Figure 4:
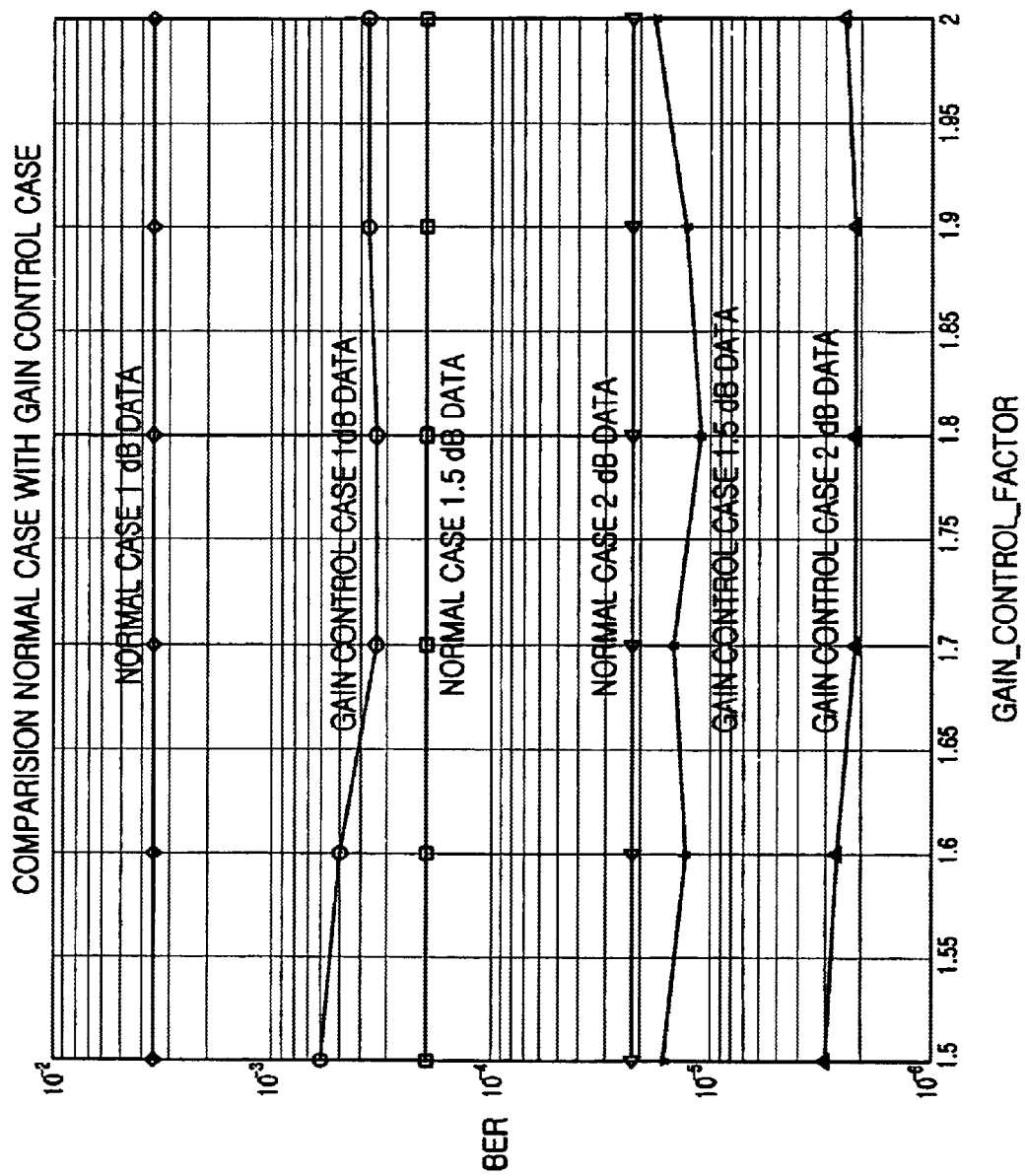
FIG. 4 is a graph illustrating bit error rates (BERs) with respect to gain control values according to an embodiment of the present invention.
Figure 5:
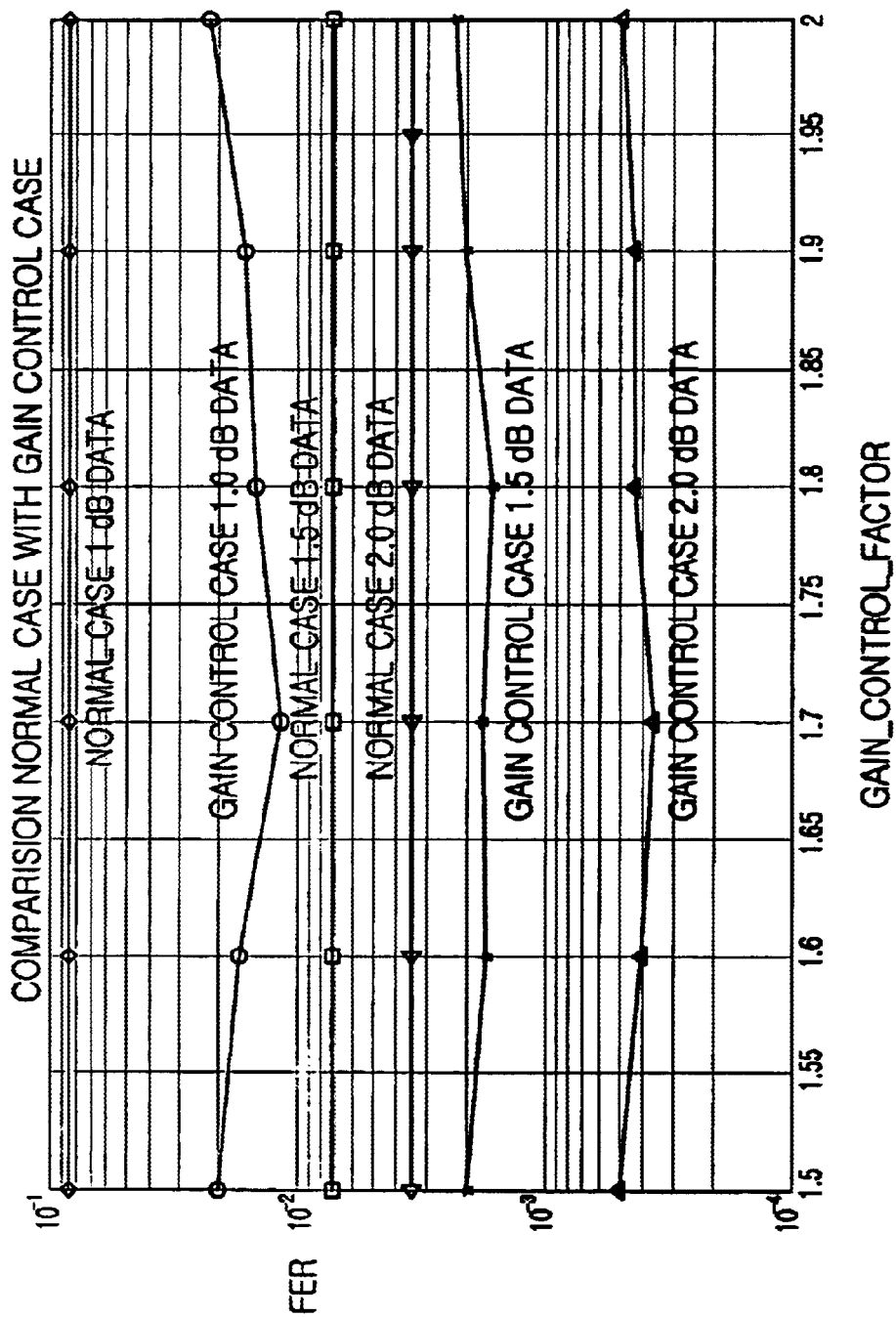
FIG. 5 is a graph illustrating frame error rates (FERs) with respect to gain control values according to an embodiment of the present invention.
Figure 6:
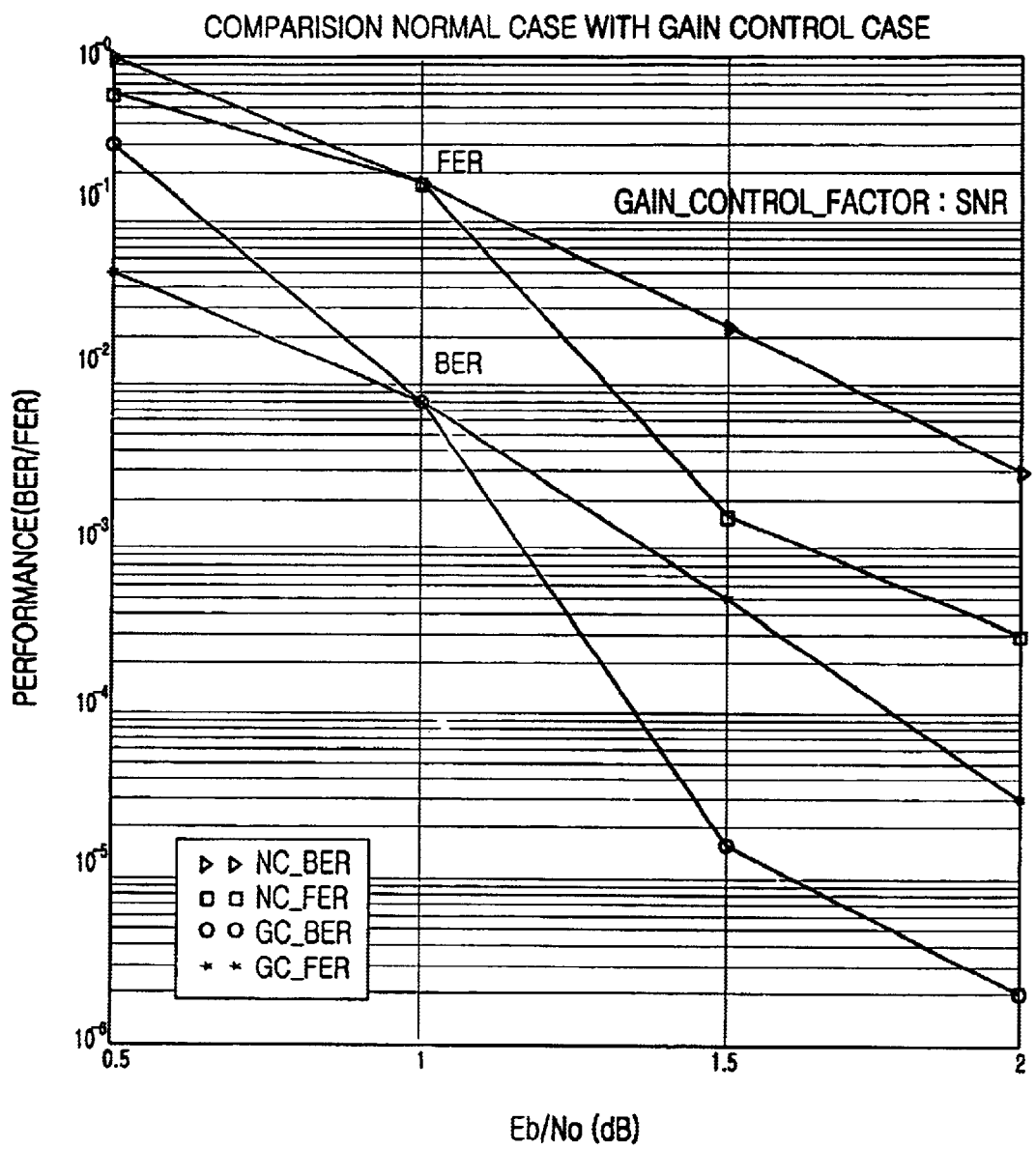
FIG. 6 is a graph illustrating BERs/FERs with respect to signal to noise ratios (SNRs) used as gain control values obtained from gain control according to embodiments of the present invention.

As described above, BER and FER are reduced by controlling the gains of the extrinsic information output from component decoders. FIGS. 4, 5, and 6 show simulation results from the above described simulation environment.

FIGS. 4 and 5 illustrate BER and FER measurements with respect to gain values in a normal case (an iterative decoder free of a gain controller) and a gain control case (an iterative decoder with a gain controller) where gains are controlled at 1.0, 1.5, and 2. dB of $E_b/N_o$, according to an embodiment of the present invention. Here, the BERs and FERs are measured at every 0.1 gain control value ranging from 1.5 to 2.0.

It can be noted from FIG. 4 that the iterative decoder with a gain controller exhibits a lower BER, especially at gain control factors of 1.7 to 1.9, than the general iterative decoder. It can be noted from FIG. 5 that the iterative decoder with a gain controller exhibits a lower FER, especially at gain control factors of 1.6 to 1.7 than the general iterative decoder.

FIG. 6 is a graph comparing a normal case with a gain control case in terms of performance. Here, extrinsic information output is divided by an SNR with the SNR used as a gain control factor and the resulting value is applied to the input of the next end. The gain control case shows poor performance in comparison with the normal case between 0.5 dB and 1 dB of $E_b/N_o$. As inferred from the above two results, a scaling factor 0.5 (=½) at $E_b/N_o$ of 2 dB is not good as compared to the optimal gain control factor 1.7. On the other hand, the gain control case is superior to the normal case at 1.5 and 2.0 dB of $E_b/N_0$. The optimal gain control factor can again be considered to be 1.7.

As described above, the present invention reduces BER and FER by controlling the gain of the extrinsic information signals being used as decoder output in an iterative decoder.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. An iterative decoder comprising:
    a first component decoder for receiving a first extrinsic information signal, a first parity signal and a systematic code signal, for decoding the systematic code signal from the received signals, and for generating a primary decoded signal including a second extrinsic information component;
    a second component decoder for receiving the primary decoded signal from the first component decoder and a second parity signal, for decoding a decoded signal from the received signals, and for generating a secondary decoded signal including the first extrinsic information signal; and
    a gain controller for attenuating the second extrinsic information signal of the primary decoded signal received from the first component decoder by an attenuation value within a predetermined range between 1 and 2.5.

2. The iterative decoder of claim 1, wherein the gain controller is an attenuator having a fixed attenuation value.

3. The iterative decoder of claim 2, wherein the fixed attenuation value is 1.7.

4. An iterative decoder comprising:
    a first component decoder for receiving a first extrinsic information signal, a first parity signal, and a systematic code signal, for decoding the systematic code signal from the received signals, and for generating a primary decoded signal including a second extrinsic information component;

a second component decoder for receiving the decoded signal from the first component decoded and a second parity signal, for decoding a decoded signal from the received signals, and for generating secondary decoded signal including the first extrinsic information signal; and a gain controller for attenuating the first extrinsic information signal in the secondary decoded signal received from the second component decoder.

5. The iterative decoder of claim 4, wherein the gain controller is an attenuator having a fixed attenuation value.

6. The iterative decoder of claim 5, wherein the fixed attenuation value is 1.7.

7. The iterative decoder of claim 4, further comprising a controller for controlling the gain of the gain controller within a predetermined range.

8. The iterative decoder of claim 7, wherein the predetermined range is between 1 and 2.5.

9. An iterative decoder comprising:
a first component decoder for receiving a first extrinsic information signal, a first parity signal, and a systematic code signal, for decoding the systematic code signal from the received signals, and for generating a primary decoded signal including a second extrinsic information component;

a second component decoder for receiving the decoded signal from the first component decoder and a second parity signal, for decoding a decoded signal out of the received signals, and for generating a secondary decoded signal and the first extrinsic information signal;

a first gain controller for attenuating the second extrinsic information signal in the primary decoded signal received from the first component decoder; and a second gain controller for attenuating the first extrinsic information signal in the secondary decoded signal received from the second component decoder.

10. The iterative decoder of claim 9, wherein the first and second gain controllers are attenuators having fixed attenuation values.

11. The iterative decoder of claim 10, wherein the fixed attenuation values are 1.7.

12. The iterative decoder of claim 9, further comprising a controller for controlling the gains of the first and second gain controllers within a predetermined range.

13. The iterative decoder of claim 12, wherein the predetermined range is between 1 and 2.5.

14. A gain controlling method for an iterative decoder having a first component decoder, a second component decoder, and a gain controller, comprising the steps of:

receiving a first extrinsic information signal, a first parity signal, and a systematic code signal, decoding the systematic code signal from the received signals, and generating a primary decoded signal including a second extrinsic information component by the first component decoder;

receiving the primary decoded signal from the first component decoder and a second parity signal, decoding a decoded signal from the received signals, and generating a secondary decoded signal including the first extrinsic information signal by the second component decoder; and attenuating the second extrinsic information signal of the primary decoded signal received from the first component decoder by the gain controller by an attenuation value within a predetermined range between 1 and 2.5.

15. The method of claim 14, wherein the gain controller has a fixed attenuation value.

16. The method of claim 15, wherein the fixed attenuation value is 1.7.

17. The method of claim 15, wherein the gain of the gain controller is calculated by $$G = \text{constant}^{-1} (1 \leq \text{constant} \leq 2.5).$$

18. The method of claim 15, wherein the gain of the gain controller is calculated by $$G = M \cdot (E_b/N_o(\text{dB}))^{-1}$$

where M is a constant.

19. The method of claim 15, wherein the gain of the gain controller is calculated by $$G = f\left(\frac{1}{N} \sum_{i=1}^{N} (\text{Ext}(i) - m_{Ext})^2\right)$$

$$m_{Ext} = \frac{1}{N} \sum_{i=1}^{N} \text{Ext}(i)$$

where N is a number of information bits and Ext(i) is extrinsic information.

20. The method of claim 15, wherein the gain of the gain controller is calculated by one of a first function, a second function, and a third function, where said first function is $$G1 = \begin{cases} K_0\left(\frac{e}{N}\right) & \text{if } e \neq 0 \\ K_0 & \text{if } e = 0 \end{cases}$$

where said second function is $$G1 = \begin{cases} K_0 \exp\left(\frac{e}{N}\right) & \text{if } e \neq 0_i \\ K_0 & \text{if } e = 0 \end{cases}$$

where said third function is $$G1 = \begin{cases} K_0 \log\left(\frac{e}{N}\right) & \text{if } e \neq 0 \\ K_0 & \text{if } e = 0 \end{cases}$$

where $K_0$ is a constant, N is a number of information bits, and e is a difference between the information bits and decoded data bits.

21. A gain controlling method for an iterative decoder having a first component decoder, a second component decoder, and a gain controller, comprising the steps of:

receiving a first extrinsic information signal, a first parity signal, and a systematic code signal, decoding the systematic code signal from the received signals, and generating a primary decoded signal including a second extrinsic information component by the first component decoder;

receiving the decoded signal from the first component decoder and a second parity signal decoding a decoded signal from the received signals, and generating a secondary decoded signal including the first extrinsic information signal by the second component decoder; and attenuating the first extrinsic information signal in the secondary decoded signal received from the second component decoder by the gain controller.

22. The method of claim 21, wherein the gain controller has a fixed attenuation value.

23. The method of claim 22, wherein the fixed attenuation value is 1.7.

24. The method of claim 22, wherein the gain of the gain controller is calculated by $$G=\text{constant}^{-1}(1\leq\text{constant}\leq 2.5).$$

25. The method of claim 22, wherein the gain of the gain controller is calculated by $$G=M\cdot(E_b/N_o(\text{dB}))^{-1}$$

where M is a constant.

26. The method of claim 22, wherein the gain of the gain controller is calculated by $$G = f\left(\frac{1}{N}\sum_{i=1}^{N}(\text{Ext}(i)-m_{Ext})^2\right)$$

$$m_{Ext} = \frac{1}{N}\sum_{i=1}^{N}\text{Ext}(i)$$

where N is a number of information bits and Ext(i) is extrinsic information.

27. The method of claim 22, wherein the gain of the gain controller is calculated by one of a first function, a second function, and a third function, where said first function is $$G1 = \begin{cases} K_0\left(\frac{e}{N}\right) & \text{if } e \neq 0 \\ K_0 & \text{if } e = 0 \end{cases}$$

where said second function is $$G1 = \begin{cases} K_0\exp\left(\frac{e}{N}\right) & \text{if } e \neq 0 \\ K_0 & \text{if } e = 0 \end{cases}$$

where said third function is $$G1 = \begin{cases} K_0\log\left(\frac{e}{N}\right) & \text{if } e \neq 0 \\ K_0 & \text{if } e = 0 \end{cases}$$

where $K_o$ is a constant, N is a number of information bits, and e is a difference between the information bits and decoded data bits.

28. A gain controlling method for an iterative decoder having a first component decoder, a second component decoder, a first gain controller, and a second gain controller, comprising the steps of:

receiving a first extrinsic information signal, a first parity signal, and a systematic code signal, decoding the systematic code signal from the received signals, and generating a primary decoded signal including a second extrinsic information component by the first component decoder;

receiving the decoded signal from the first component decoder and a second parity signal decoding a decoded signal out of the received signals, and generating a secondary decoded signal and the first extrinsic information signal by the second component decoder;

attenuating second extrinsic information signal in the primary decoded signal received from the first component decoder by the first gain controller; and attenuating the first extrinsic information signal in the secondary decoded signal received from the second component decoder by the second gain controller.

29. The method of claim 28, wherein the first and second gain controllers have fixed attenuation values.

30. The method of claim 29, wherein the fixed attenuation values are 1.7.

31. The method of claim 29, wherein the gain of the gain controllers is calculated by $$G=\text{constant}^{-1}(1\leq\text{constant}\leq 2.5).$$

32. The method of claim 29, wherein the gain of the gain controllers is calculated by $$G=M\cdot(E_b/N_o(\text{dB}))^{-1}$$

where M is a constant.

33. The method of claim 29, wherein the gain of the gain controllers is calculated by $$G = f\left(\frac{1}{N}\sum_{i=1}^{N}(\text{Ext}(i)-m_{Ext})^2\right)$$

$$m_{Ext} = \frac{1}{N}\sum_{i=1}^{N}\text{Ext}(i)$$

where N is a number of information bits and Ext(i) is extrinsic information.

34. The method of claim 29, wherein the gain of the gain controllers is calculated by one of a first function, a second function, and a third function, where said first function is $$G1 = \begin{cases} K_0\left(\frac{e}{N}\right) & \text{if } e \neq 0 \\ K_0 & \text{if } e = 0 \end{cases}$$

where said second function is $$G1 = \begin{cases} K_0\exp\left(\frac{e}{N}\right) & \text{if } e \neq 0 \\ K_0 & \text{if } e = 0 \end{cases}$$

where said third function is $$G1 = \begin{cases} K_0\log\left(\frac{e}{N}\right) & \text{if } e \neq 0 \\ K_0 & \text{if } e = 0 \end{cases}$$

where $K_o$ is a constant, N is a number of information bits, and e is a difference between the information bits and decoded data bits.

* * * * *